US007403713B2

United States Patent
Sasaki et al.

(10) Patent No.: US 7,403,713 B2
(45) Date of Patent: Jul. 22, 2008

(54) QUANTUM SOURCE CODING APPARATUS AND QUANTUM INFORMATION COMMUNICATION SYSTEM

(75) Inventors: Masahide Sasaki, Koganei (JP); Yasuyoshi Mitsumori, Koganei (JP); Atsushi Hasegawa, Koganei (JP); Masahiro Takeoka, Koganei (JP); John A. Vaccaro, College Lane Hatfield (GB); Stephen M. Barnett, Glasgow (GB); Erika Andersson, Glasgow (GB)

(73) Assignees: University of Hertfordshire, Hatfield (GB); National Institute of Information and Communications Technology, Koganei-shi (JP); University of Strathclyde, Glasgow (GB)

( * ) Notice: Subject to any disclaimer, the term of this patent is extended or adjusted under 35 U.S.C. 154(b) by 540 days.

(21) Appl. No.: 10/792,379

(22) Filed: Mar. 4, 2004

(65) Prior Publication Data
US 2004/0234264 A1 Nov. 25, 2004

(30) Foreign Application Priority Data
Mar. 5, 2003 (JP) ............................ 2003/058441

(51) Int. Cl.
*H04J 14/00* (2006.01)
*H04B 10/04* (2006.01)
*H04B 10/12* (2006.01)
(52) U.S. Cl. ........................................ 398/77; 398/201
(58) Field of Classification Search ................. 398/122, 398/140, 135, 138, 183
See application file for complete search history.

(56) References Cited

U.S. PATENT DOCUMENTS

2003/0093451 A1* 5/2003 Chuang et al. .............. 708/520
2004/0156407 A1* 8/2004 Beausoleil et al. ............ 372/43

FOREIGN PATENT DOCUMENTS

| EP | 0 920 149 A2 | 6/1999 |
| EP | 0 920 149 A3 | 6/1999 |

OTHER PUBLICATIONS

"Optical Simulation of Quantum Logic," to Cerf et al., 1998 Physics Review vol. 57 No. 3.*
Cerf et al., "Optical Simulation of Quantum Logic", arXiv, 1997.*
C.E. Shannon; Bell System Technical Journal, 1948, vol. 27, pp. 379-656.
N. Gisin et al.; *Quantum cryptography*, Review of Modern Physics, 2002, vol. 74, pp. 145-195.
Mitsumori, Y. et al., "*Experimental demonstration of quantum source coding*", Physical Review Letters, vol. 91, No. 21, pp. 217902/1-4 (Nov. 21, 2003).

(Continued)

*Primary Examiner*—Shi K Li
(74) *Attorney, Agent, or Firm*—Westerman, Hattori, Daniels & Adrian, LLP.

(57) ABSTRACT

Quantum source coding apparatus for communication of quantum information comprising: a quantum state preparation device for converting input messages into block messages; a coding device for producing coded signals by compressing the block messages prepared by the quantum state preparation device; and an output device for outputting the coded signals produced by the coding device.

2 Claims, 3 Drawing Sheets

OTHER PUBLICATIONS

Langford, J., "*Generic quantum block compression*", Physical Review A, vol. 65, No. 5, pp. 52312/1-4 (May 2002).

Cleve R. et al., "Schumacher's *quantum data compression as a quantum computation*", Physical Review A, vol. 54, No. 4, pp. 2636-2650 (Oct. 1996).

Braunstein, S. L. et al., "*A quantum analog of Huffman coding*", IEEE Transactions on Information Theory, vol. 46, No. 4, pp. 1644-1649 (Jul. 2000).

Bennett, C. H. et al., "*Quantum information and computation*", Nature, vol. 404 (2000 Macmillan Magazines, Ltd., London), pp. 247-255 (Mar. 16, 2000).

Schumacher, B., "*Quantum coding*", Physical Review A, vol. 51, No. 4 (The American Physical Society), pp. 2738-2747 (Apr. 1995).

Jozsa, R. et al, "A new proof of the quantum noiseless coding theorem", Journal of Modern Optics, vol. 41, No. 12 (Taylor & Francis, Ltd.), pp. 2343-2349 (1994).

Cerf, N. J. et al., "*Optical simulation of quantum logic*", Physical Review A, vol. 57, No. 3 (The American Physical Society), pp. R1477-R1480 (Mar. 1998).

Spreeuw, R. J. C., "*A classical analogy of entanglement*", Foundation of Physics vol. 28, No. 3 (Plenum Publishing Corporation), pp. 361-374 (1998).

* cited by examiner

QUANTUM SOURCE CODING APPARATUS AND QUANTUM INFORMATION COMMUNICATION SYSTEM

FIELD OF THE INVENTION

The present invention relates generally to a quantum source coding apparatus and a quantum information communication system using the same.

BACKGROUND OF THE INVENTION

The encoding of messages has an important role in information theory. Two basic problems entail representing messages efficiently and transmitting messages precisely. The former is called "source coding" and is related to data compression. The latter is called "channel coding" and is concerned with error correction. All information processing techniques are connected with these two problems.

Messages comprise sequences of various letters and usually the frequencies of the letters are not equal. The unequal frequencies imply a redundancy that enables the compression of the message. Classical source coding entails the coding of common letters as short sequences of code symbols (such as the binary digits {0, 1}) and uncommon letters as longer code sequences. Shannon's source coding theorem [C. E. Shannon, *Bell Syst. Tech. J.* 27, 379 (1948)] gives the bounds on the degree a classical message can be compressed. For a source alphabet {A, B, ..., Z} with given prior probabilities {P(A), P(B), ..., P(Z)}, the minimum average length of the encoded message is given by the Shannon entropy:

$$H = -\sum_{n=A,B,\ldots} P(n)\log_2 P(n). \qquad (1)$$

H takes its maximum value when all letters appear with equal probability. Then any compression is impossible.

The quantum domain, however, offers new possibilities [C. H. Bennett and D. P. DiVincenzo, *Nature* (London) 404, 247 (2000)]. In particular, there is another kind of redundancy when the letters are conveyed by non-orthogonal quantum states, $|\Psi_A\rangle, |\Psi_B\rangle, |\Psi_C\rangle, \ldots$ with corresponding probabilities, $P_A, P_B, P_C \ldots$, Namely, compression is possible even if $P_A = P_B = P_C = \ldots$, in contrast to the classical case. Recently, Schumacher and Jozsa derived the quantum version of the source coding theorem [B. Schumacher, *Phys. Rev.* A 51, 2738 (1995), R. Jozsa and B. Schumacher, *J. Mod. Opts.* 41, 2343 (1994)]. The quantum noiseless coding theorem implies that, by coding the quantum message in blocks of K letters, $KS(\hat{\rho})$ qubits are sufficient to encode each block in the limit $K\to\infty$ where $S(\hat{\rho})$ is the von Neumann entropy of the density operator $$\hat{\rho} = \Sigma P_n |\psi_n\rangle\langle\psi_n|,$$

that is, $$S(\hat{\rho}) = -\sum_i \lambda_i \log_2 \lambda_i$$

where $\{\lambda_i\}$ is the set of eigenvalues of $\hat{\rho}$.

Quantum source coding plays a central role in quantum information theory. In addition, quantum source coding has practical advantages in the compression of non-orthogonal data sets. For example, in long-haul optical communication channels the optical signals suffer significant attenuation and one must deal with sequences of pulses in non-orthogonal coherent states. Compressing the sequences before storing or relaying to another channel can save expensive quantum channel resources. Sequences of non-orthogonal states are also essential for many quantum cryptographic schemes [N. Gisin, G. G. Ribordy, W. Tittel, and H. Zbinden, *Rev. Mod. Phys.* 74, 145 (2002)]. In particular, for a fixed rate of quantum key generation per transmitted letter state, any compression of the sequence will potentially give a more efficient use of the quantum channel.

Despite its importance from both fundamental and practical perspectives, quantum source coding has not, however, been demonstrated experimentally and, moreover, the specific apparatus able to realize it is unknown. One objective of the present invention is to provide an apparatus that can realize quantum source coding. Another objective of the present invention is to provide a quantum information communication system using the apparatus.

SUMMARY OF THE INVENTION

The quantum source coding apparatus of the present invention converts input messages into block messages which are, for example, encoded in the polarization modes and the propagation routes taken by photons. The apparatus performs quantum source coding by reducing the number of routes and polarization modes that carry the quantum information content of the block message. We use the term "block message" to refer to a message, whether a whole message or part of a larger message, that consists of more than one letter or symbol and which is coded as a complete unit. The quantum source coding apparatus may be referred to herein as the "quantum coding apparatus", the quantum source decoding apparatus may be referred to as the "quantum decoding apparatus", the propagation routes taken by photons as "routes", and a compressed block message as a "coded signal".

According to a first aspect of the present invention there is provided quantum source coding apparatus for communication of quantum information comprising: a quantum state preparation device for converting input messages into block messages; a coding device for producing coded signals by compressing the block messages prepared by the quantum state preparation device; and an output device for outputting the coded signals produced by the coding device. The quantum state preparation entails the preparation of quantum states to represent the block messages. The quantum coding apparatus compresses the block message by reducing the resources required to carry (or encode) the quantum information contained in the block message. The quantum coding apparatus operates sequentially in that the output device takes as its input the coded signals produced by the coding device, and the coding device takes as its input the block messages produced by the quantum state preparation device.

Preferably, but not necessarily, the quantum state preparation device comprises one or more half wave plates (HWPs) and one or more polarizing beam splitters (PBSs), and the block messages are encoded in quantum states describing the propagation routes taken and polarization modes occupied by photons. The quantum coding apparatus may encode block messages in the quantum states of the photons by adjusting the photons' probability amplitudes for propagating along various routes and occupying various polarization modes.

Preferably, but not necessarily, the coding device is arranged to compress the block messages by discarding photons in any of the multiple routes or polarization modes.

Preferably, but not necessarily, the coding device is further arranged to reintroduce photons in different routes and polarization modes.

According to a second aspect of the invention there is provided quantum source coding apparatus for communication of quantum information comprising: a coding device for producing coded signals by compressing block messages; and an output device for outputting the coded signals produced by the coding device.

According to a third aspect of the invention there is provided a quantum information communication system comprising a quantum source coding apparatus in accordance with the first aspect of the invention and a quantum source decoding apparatus, wherein the quantum source coding apparatus comprises: a quantum state preparation device for converting input messages into block messages, a coding device for producing coded signals by compressing the block messages prepared by the quantum state preparation device, and an output device for outputting the coded signals produced by the coding device; and wherein the quantum source decoding apparatus comprises: a device for receiving coded signals produced by the quantum source coding apparatus, and a device for decoding the received coded signals.

The quantum decoding apparatus, in essence, inverts the coding operation of the quantum coding apparatus. The quantum decoding apparatus comprises a device for receiving the coded signals produced by the quantum coding apparatus and a device for decoding the received coded signals. In the quantum information communication system, the quantum coding apparatus encodes input messages as coded signals. The coded signals are relayed to the quantum decoding apparatus which decodes the coded signals.

Thus, according to a fourth aspect of the invention there is provided quantum source decoding apparatus comprising: a device for receiving coded signals produced by quantum source coding apparatus, and a device for decoding the received coded signals.

According to a fifth aspect of the invention there is provided a method of communicating quantum information, comprising: converting input messages into block messages; producing coded signals by compressing the block messages; and outputting the coded signals.

According to a sixth aspect of the invention there is provided a method of communicating quantum information, comprising: receiving block messages; producing coded signals by compressing the block messages; and outputting the coded signals.

An example of a quantum coding apparatus and an example of a quantum information communication system, both in accordance with the present invention, are described below.

BRIEF DESCRIPTION OF THE DRAWINGS

Embodiments of the invention will now be described, by way of example, and with reference to the drawings in which.

DETAILED DESCRIPTION OF PREFERRED EMBODIMENTS

Figure 1:
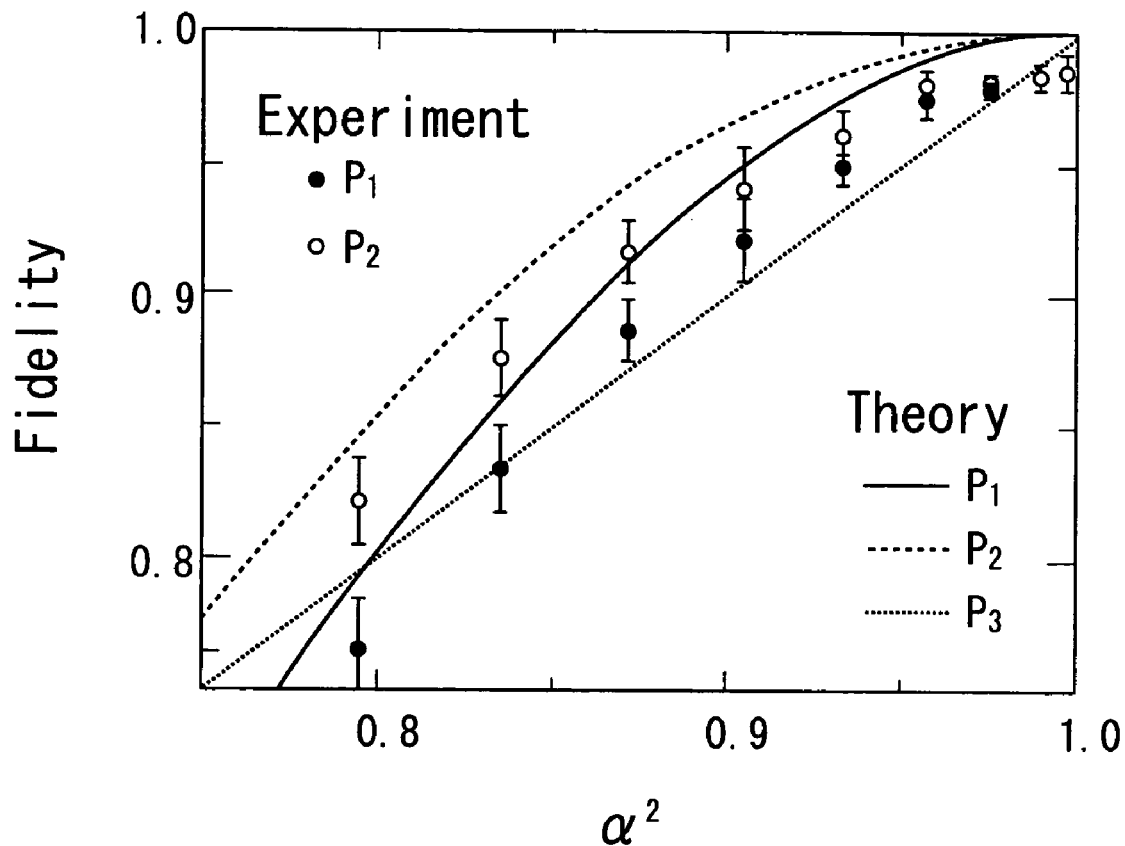
FIG. 1 compares the fidelities of various protocols for two examples of the quantum coding apparatus. Closed circles represent experimental fidelities for Example 1, which implements protocol $P_1$, and open circles represent experimental fidelities for Example 2, which implements protocol $P_2$.

The present embodiments represent the best ways known to the applicant of putting the invention into practice. However they are not the only ways in which this can be achieved.

The present invention realizes quantum source coding in accordance with the quantum noiseless coding theorem of B. Schumacher, *Phys. Rev.* A 51, 2738 (1995) and R. Jozsa and B. Schumacher, *J. Mod. Opts.* 41, 2343 (1994). We begin with an explanation of the quantum coding protocols described in the latter of these articles as follows.

1. Quantum Coding Protocols

Alice (Sender) needs to send Bob (Receiver) a message composed of the binary letters, "+" and "−" over a quantum communication channel. The letters are represented by the quantum states $|\psi+\rangle$ and $|\psi-\rangle$, $$|\psi_\pm\rangle = \alpha|0\rangle \pm \beta|1\rangle \quad (2)$$

which are called letter states. Here, $|0\rangle$ and $|1\rangle$ are an orthonormal (computational) basis and $\alpha^2+\beta^2=1$. For clarity we assume that $\alpha$(alpha) and $\beta$(beta) are real numbers although in general they can be complex. Let the letter states occur with equal likelihood. The von Neumann entropy $S(\hat{\rho})$ of the average state $\hat{\rho}$ of a letter is then $S(\hat{\rho})=-\alpha^2\log_2\alpha^2-\beta^2\log_2\beta^2$, where $\hat{\rho}=\alpha^2|0\rangle\langle 0|+\beta^2|1\rangle\langle 1|$.

If the letter states are orthogonal, then $\alpha^2=\beta^2=\frac{1}{2}$ which gives $S(\hat{\rho})=1$, and so any faithful compression is impossible. On the other hand, the von Neumann entropy of $\hat{\rho}$ is 0.4690 bit for the case $\alpha^2=0.9$ [R. Jozsa and B. Schumacher, J. Mod. Opts. 41, 2343 (1994)]. According to the quantum source coding theorem, Alice needs approximately ½ qubit per letter state to faithfully transmit the message to Bob by block coding in the limit of large blocks lengths. For the practical case of finite block length, however, compression-decompression is associated with finite errors.

Following [R. Jozsa and B. Schumacher, J. Mod. Opts. 41, 2343 (1994)], we use blocks of three letter states:

$$|B_L\rangle = |\psi_{L_1}\rangle \otimes |\psi_{L_2}\rangle \otimes |\psi_{L_3}\rangle \quad (3)$$

where $L=(L_1,L_2,L_3)$ and $L_1$, $L_2$, and $L_3 \in \{+,-\}$. The index L selects one of eight possible letter state configurations. Alice applies a unitary transformation $\hat{U}$ which leaves all computational basis states unchanged except for the following mapping:

$$\hat{U}|001\rangle = |011\rangle \text{ and } \hat{U}|011\rangle = |100\rangle.$$

(Here, and in the following, we write states such as $|n\rangle \otimes |m\rangle \otimes \ldots$ in the more compact form $|nm\ldots\rangle$). Then Alice makes a projection measurement of the first (leftmost) qubit in the computational basis. The measurement result $|0\rangle$ occurs with probability $p=\alpha^4(1+2\beta^2)$ and results in the state $$|C_L\rangle \equiv \frac{1}{\sqrt{1+2\beta^2}}(\alpha|00\rangle + \beta_{L_1}|11\rangle + \beta_{L_2}|10\rangle + \beta_{L_3}|01\rangle) \quad (4)$$

being transmitted through the two-qubit quantum channel. Here $\beta_{L_n} \equiv L_n\beta$ represents the coefficient $\beta$ in Equation (2) for the nth letter state of the block state in Equation (3). The measurement result |1> occurs with probability 1−p. We consider two different protocols corresponding to two different actions Alice takes when the projective measurement results in the state |1>.

The first protocol, $P_1$, treats the projection measurement result |1> as a failure. In this protocol, the compressed state transmitted through the two-qubit quantum channel is $\hat{\rho}_L^{(1)} = |C_L\rangle\langle C_L|$ with probability p, and the vacuum (i.e. no photon) state |vac> with probability 1−p.

Bob decodes the state $\hat{\rho}_L^{(1)}$ at the receiving end of the two-qubit quantum channel by preparing an extra qubit as a new first qubit in the state |0> and applying the inverse $\hat{U}^\dagger$ of the unitary transformation $\hat{U}$. This results in the decoded state as follows:

$$\hat{\Phi}_L^{(1)} = \hat{U}^\dagger(|0\rangle\langle 0| \otimes \hat{\rho}_L^{(1)})\hat{U}.$$

The fidelity of the whole quantum coding-decoding operation for $P_1$ is given by $$F_1 = \sum_L \frac{1}{8}\langle B_L|\hat{\Phi}_L^{(1)}|B_L\rangle = \alpha^8(1+2\beta^2)^2. \quad (5)$$

$F_1$ is plotted as the solid curve in FIG. 1 and has a value of 0.9448 at $\alpha^2 = 0.9$.

The second protocol, $P_2$, yields a higher fidelity than that of $P_1$. In this case, Alice prepares the quantum channel in the state |00> in the event that her projection measurement results in the state |1>. This operation results in the average state of the quantum channel being given by:

$$\hat{\rho}_L^{(2)} = \alpha^4(1+2\beta^2)|C_L\rangle\langle C_L| + \beta^4(1+2\alpha^2)|00\rangle\langle 00|. \quad (6)$$

Bob again adds an extra qubit in the state |0> and applies the inverse operation $\hat{U}^\dagger$ to produce the state $\hat{\Phi}_L^{(2)} = \hat{U}^{554}(|0\rangle\langle 0| \otimes \hat{\rho}_L^{(2)})\hat{U}$ which has the fidelity $$F_2 = \alpha^8(1+2\beta^2)^2 + \alpha^6\beta^4(1+2\alpha^2). \quad (7)$$

$F_2$ has a value of 0.9652 at $\alpha^2 = 0.9$. The dashed curve in FIG. 1 is a plot of $F_2$ for a range of $\alpha$ values.

In the above protocols, the unitary operation $\hat{U}$ is performed before the projection measurement. However this ordering is not essential; a suitable projective measurement could be performed first followed by a corresponding unitary transformation, to yield exactly the same end results, as described in R. Jozsa and B. Schumacher, J. Mod. Opts. 41, 2343 (1994).

Finally, Jozsa and Schumacher also considered a simple protocol, $P_3$, where Alice discards the state of every third letter and encodes the remaining letters in a block of two qubits, and Bob generates the state |0> for the missing letter state. This protocol yields an average fidelity of $F_{3=\alpha}^2$, which is given by the dotted curve in FIG. 1.

2. Quantum Coding Apparatus

Figure 2:
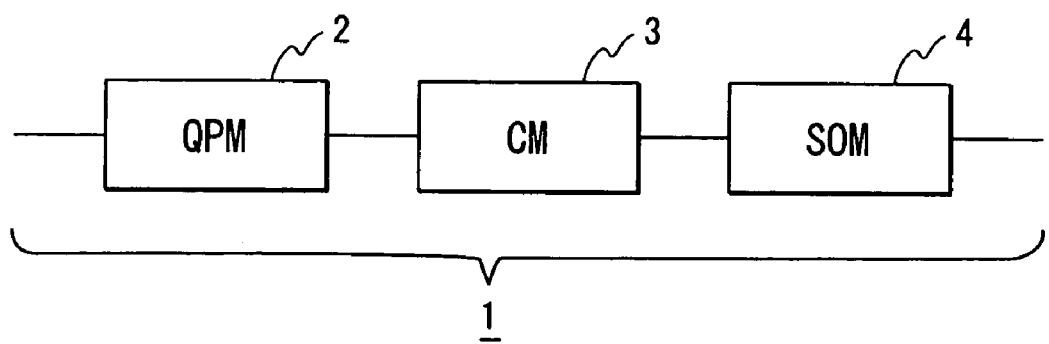
FIG. 2 is a block diagram that shows the basic structure of the quantum coding apparatus in accordance with the present invention.

FIG. 2 shows a schematic diagram for the quantum coding apparatus in accordance with the present invention. As the diagram illustrates, the quantum coding apparatus (1) comprises a quantum state preparation device (2), a coding device (3) and a quantum signal output device (4).

The quantum state preparation device (2) is a means for converting input messages into block messages. The block messages are represented by quantum states. The coding device (3) is a means for producing the coded signals by compressing the block messages. The quantum signal output device (4) is a means for outputting the coded signal. As shown in the figure, these devices act sequentially in that the results of the quantum state preparation device is the input to the coding device and the result of the coding device is the input to the signal output device.

Figure 3:
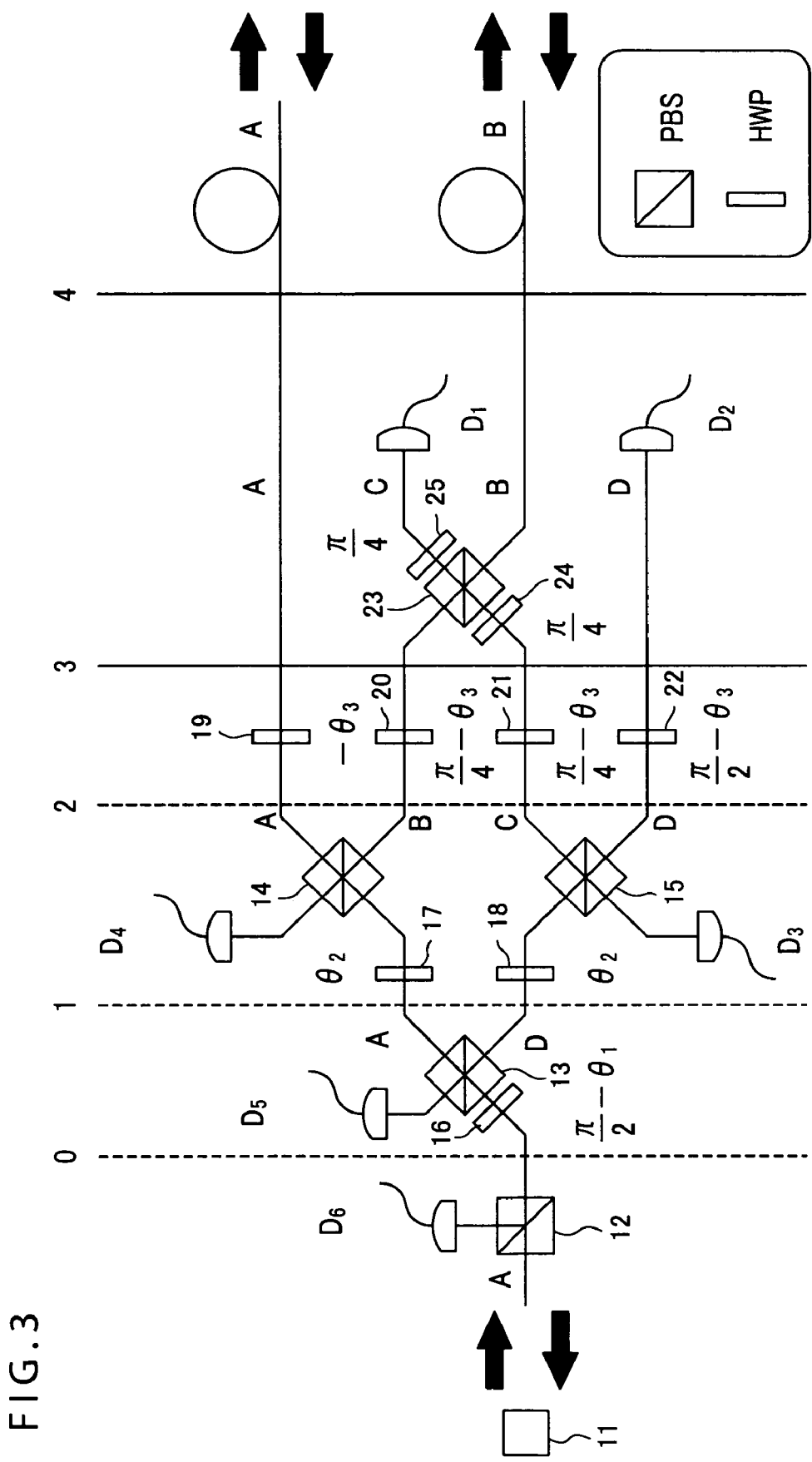
FIG. 3 shows a schematic for Example 1 of the quantum coding apparatus.

FIG. 3 is a schematic diagram of an example construction of a quantum coding apparatus for 3-qubit block messages. The quantum coding apparatus comprises polarizing beam splitters (PBSs), half wave plates (HWPs) and photo detectors (PDs). A photon is used to represent the three qubits in each block message in terms of two location qubits (the first two qubits) and a polarization qubit (the third qubit) as shown in N. J. Cerf, C. Adami, and P. G. Kwiat, Phys. Rev. A57, R1477 (1998), R. J. C. Spreeuw, Found. Phys. 28, 361 (1998) and S. Takeuchi, Proc. p.299, PhysComp96 (Boston, 1996).

Figure 4:
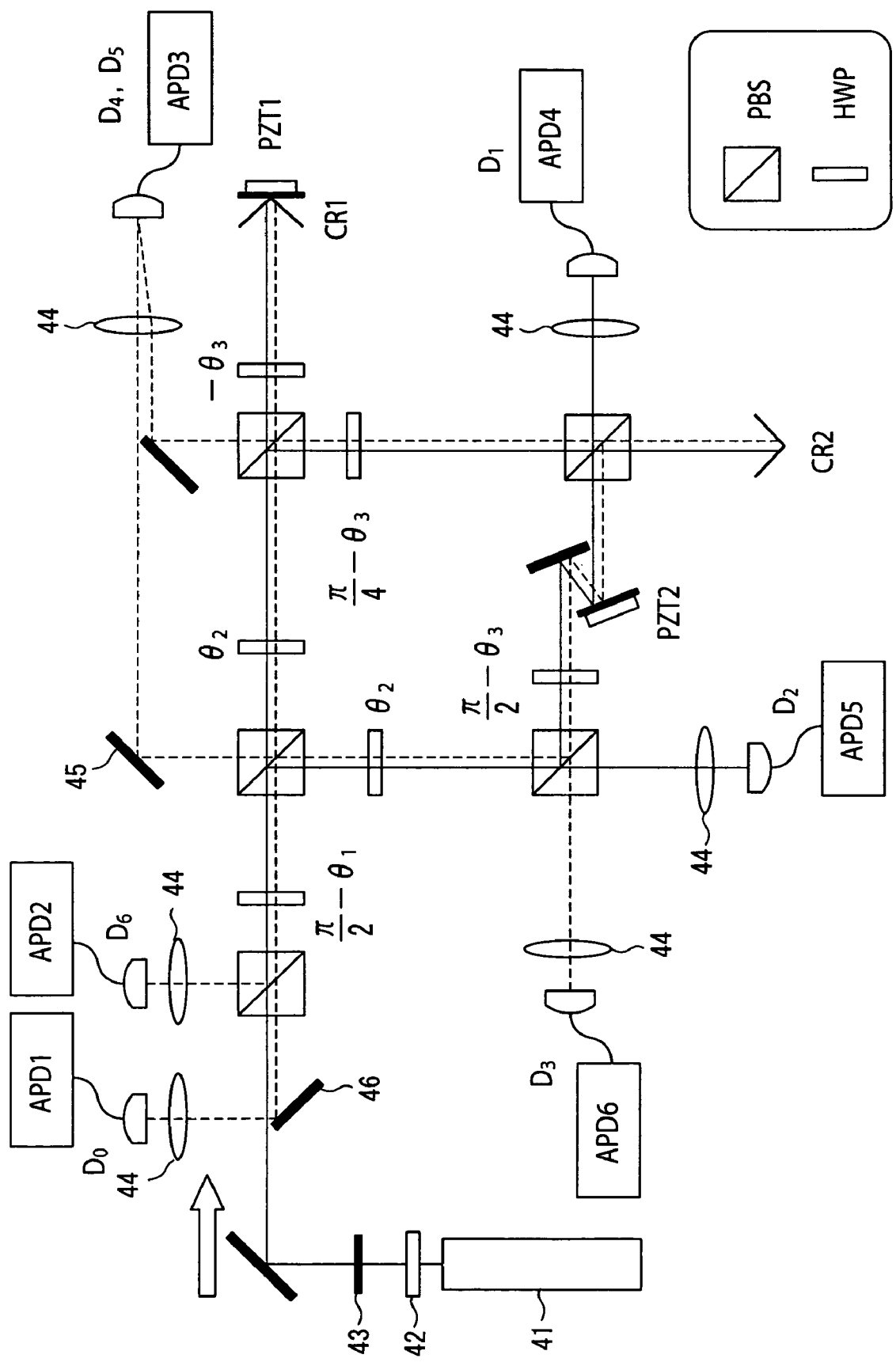
FIG. 4 depicts the experimental circuit used for implementing Example 1 of the quantum coding apparatus.

Routes A, B, C and D at the vertical line labeled 3 in FIG. 4 represent the location qubit basis states |00>, |01>, |10> and |11>, respectively, corresponding to the first two qubits of the block message. The polarization of the photon in these routes represents the polarization qubit with horizontal and vertical polarization corresponding to the basis states |0>, and |1>, respectively, for the last qubit of the 3 qubit block message. The horizontal and vertical polarization directions are taken to be parallel and orthogonal, respectively, to the plane of the optical circuit illustrated in FIG. 3. The apparatus shown in FIG. 3 can represent an arbitrary state in an 8 dimensional vector space spanned by the basis states |000>, |001>, ... |111>, each of which corresponds to a unique route and polarization mode.

We now describe, in detail, the devices that constitute the quantum coding apparatus exemplified in FIG. 3. In FIG. 3, $D_i$ (i=1 to 6) indicates a photo-detector, HWP indicates a half wave plate, PBS indicates a polarizing beam splitter and A to D indicates the routes. Further, the arrows indicate the propagation direction of each photon.

2.1. Quantum State Preparation Device

The quantum state preparation device is a means for converting the input messages into block messages which are encoded in terms of quantum states. This device could, for example, comprise one or more HWPs and one or more PBSs.

The example of the quantum state preparation device in FIG. 3 (left side part of line 3) comprises a photon input section (11), four PBSs (12-15) and seven HWPs (16-22). A PBS is an optical element that separates two polarization modes of the input light into two output propagation directions. In the example quantum coding apparatus depicted in FIG. 3, PBSs are used to separate light into horizontally polarized and vertically polarized parts. A HWP is an optical device that alters the polarization of light. In the example in FIG. 3, HWPs are used to rotate the polarization of photons. Horizontally polarized photons enter the apparatus at the light input section (11) and are directed towards PBS (12). In FIG. 3, the first PBS (12) is a non-essential element for the quantum coding apparatus.

2.2. Quantum State Preparation Method

The quantum state preparation device prepares the quantum state to represent the state of the block message. In our example, the quantum state of a photon is prepared to represent a block message of 3 binary letter states as defined in Equation (3). A horizontally polarized photon enters the light input section (11) and passes without change through the first PBS. In the following, we parameterize the coefficient $\beta_{L_n}$ of the nth letter state by the angle).

$$\theta_n = \frac{1}{2}\arcsin(\beta_{L_n}).$$

2.2.1. First Qubit Preparation Process

The first location qubit is prepared by HWP (16) and PBS (13) between vertical lines labeled 0 and 1. Namely, the polarization of the input photon is first rotated by HWP (16), whose fast axis is orientated at an angle of $\pi/2-\theta_1$ to the vertical, so that the polarization of the photon becomes inclined at an angle of $2\theta_1$ to the horizontal. The PBS (13) then separates the horizontal and vertical polarizations into transmitted and reflected directions, respectively. This results in the photon propagating in a superposition of the routes marked A and D to the right of PBS (13) in FIG. 3. The probability amplitudes for propagating along routes A and B are $\alpha$ and $\beta_{L_1}$, respectively, as required for the state of the first qubit in Equation (3). These amplitudes can be adjusted by altering the associated angle $\theta_1$ using HWP (16).

2.2.2. Second Qubit Preparation Process

The second qubit is prepared using the HWPs and PBSs between the vertical lines labeled 1 and 2 in FIG. 3 as follows. The photon prepared by the first qubit preparation process propagates along routes A and D which are directed through the HWPs (17) and (18) and into the PBSs (14) and (15), respectively. The HWPs (17) and (18), whose fast axes are inclined at an angle of $\theta_2$ to the vertical, rotate the polarization of the optical field in routes A and D by the angles $\pi+2\theta_2$ and $2\theta_2$, respectively. The PBSs (14) and (15) separate the horizontal and vertical polarizations into transmitted and reflected directions, respectively, resulting in the photon propagating in a superposition of the 4 routes marked A, B, C and D to the right of PBSs (14) and (15). The probability amplitudes for the photon propagating along these routes are $-\alpha^2$, $\alpha\beta_{L_2}$, $\alpha\beta_{L_1}$ and $\beta_{L_1}\beta_{L_2}$, respectively. These routes corresponds to the qubit basis states |00>, |01>, |10>, and |11>, respectively, of the first two qubits. Adjusting the value of the angle $\theta_2$ prepares different states of the second qubit.

2.2.3. Third Qubit Preparation Process

The third qubit, being the polarization qubit, is prepared by setting the polarization of the optical field in each of the routes A, B, C and D between vertical lines 2 and 3 in FIG. 3. The polarization settings are realized using the HWPs (19), (20), (21) and (22) with fast axes orientated at angles of $-\theta_3$, $\pi/4-\theta_3$, $\pi/4-\theta_2$ and $\pi/2-\theta_3$ to the vertical, respectively. This results in the optical field in each of the routes being polarized along a direction that is inclined at an angle of $2\theta_3$ to the horizontal. Adjusting the value of the angle $\theta_3$ prepares different states of the third qubit. The probability amplitudes for the photon to occupy the horizontal and vertical polarization modes, respectively, are $\alpha^3$ and $\alpha^2\beta_{L_3}$ for route A,
$\alpha^2\beta_{L_2}$ and $\alpha\beta_{L_2}\beta_{L_3}$ for route B,
$\alpha^2\beta_{L_1}$ and $\alpha\beta_{L_1}\beta_{L_3}$ for route C, and
$\alpha\beta_{L_1}\beta_{L_3}$ and $\beta_{L_1}\beta_{L_2}\beta_{L_3}$ for route D.

In this example of the quantum coding apparatus, 3-qubit block message are prepared using four propagation routes and two orthogonal polarization modes, but the quantum state preparation device is not limited to 3-qubit blocks, four optical propagation routes or two polarization modes. An apparatus with more optical propagation routes or using optical fields with nonzero orbital angular momentum, for example, will allow larger block messages and hence compression with higher fidelity. Also, in the above example, the quantum coding apparatus uses HWPs and PBSs to prepare the quantum state, but the quantum state preparation device is not limited to using HWPs and PBSs.

2.3. Coding Device

The coding device is a means for producing the coded signals by compressing the block messages. One example of the coding device contains one or more HWPs and one or more PBSs. The example of a coding device shown in FIG. 3 between lines 3 and 4 compresses the block message by applying a unitary transformation and discarding any photon emerging from two of the four routes. The block message is therefore compressed from four routes (and two polarization modes) into two routes (and two polarization modes). The two discarded routes correspond to the component of the quantum block message states lying in the least-likely 2 dimensional subspace. Hence only the most-likely component of the block message state is retained by the coding device. The quantum coding apparatus in FIG. 3 gives just one example of a coding device, and there may be a variety of coding devices that comprise suitable HWPs and PBSs, and so on, depending on the particular construction of the quantum state preparation device. The block message may also be prepared by means other than the quantum state preparation device described above. In that case additional nonlinear optical processes may be needed for the coding device.

2.4. Coding Process

In the coding process, the coding device compresses the block message by reducing the number of routes and polarization modes that carry the block message. The HWPs (23) and (24) and the PBS (25) in the apparatus shown in FIG. 3 apply a unitary transmission to the middle two routes. The fast axes of the HWPs are orientated at an angle of $\pi/4$ to the vertical. The combination of the HWPs and the PBS acts to exchange the polarizations of the middle two routes so that the probability amplitudes for the photon to occupy the horizontal and vertical polarization modes are, respectively, $\alpha^3$ and $\alpha^2\beta_{L_3}$ for route A,
$\alpha^2\beta_{L_2}$ and $\alpha^2\beta_{L_1}$ for route B,
$\alpha\beta_{L_2}\beta_{L_3}$ and $\alpha\beta_{L_1}\beta_{L_3}$ for route C, and
$\alpha\beta_{L_1}\beta_{L_2}$ and $\beta_{L_1}\beta_{L_2}\beta_{L_3}$ for route D.

The photo detectors $D_1$ and $D_2$ detect photons in routes C and D. As described above, the coding device compress the block message by discarding any photons detected in these routes.

The method for compressing the block messages is not limited to this example. The compression could be implemented by more general unitary transformations and discarding photons on any number of routes.

2.5. Quantum Signal Output Device

The quantum signal output device is a means for transferring the coded signal produced by the coding device onto a quantum communication channel. The example of the quantum signal output device shown in FIG. 3 (right side of line 4) outputs the photon on both routes A and B which represent a two-qubit communication channel. In general, the output device could transfer coded signals onto multi-qubit quantum communication channels. Another example of a quantum signal output device is a set of couplers for transmitting the coded signals through optical fibers.

3. Quantum Decoding Apparatus

A quantum decoding apparatus is an apparatus for decoding the coded signal produced by a quantum coding apparatus. The quantum decoding apparatus comprises a coding signal receiving device and a decoding device.

The coding signal receiving device is a means for receiving the coded signals transmitted by the quantum coding apparatus. The decoding device is a means for decoding the coded signals.

A quantum decoding apparatus is, in effect, a mirror image of the quantum coding apparatus. In the absence of the two photo detectors, the quantum coding apparatus shown between lines 3 and 4 in FIG. 3 is an example of a quantum decoding apparatus for photons propagating along routes A and B from right to left.

4. Quantum Information Communication System

The quantum information communication system comprises a quantum coding apparatus and a quantum decoding apparatus. Both the quantum coding apparatus and the quantum decoding apparatus are explained above.

EXAMPLE 1

Implementation of Protocol $P_1$

FIG. 4 depicts an example of an experimental circuit which implements protocol $P_1$. The orientation angle of each HWP is given in the figure near the HWP. For practical convenience, we did not construct an additional mirror-image circuit for the decoding and fidelity check. Instead, we used corner reflectors (CR1 and CR2) to reflect the light in the quantum channel back through the circuit (shown as dashed lines in the figure) so that the coding and quantum state preparation circuits also operate as decoding and quantum state measurement circuits for the reflected light. Perfect fidelity of the combined coding and decoding operation corresponds to the arrival of a photon at the mirror labeled (46). We used strongly attenuated light from a He—Ne laser (wavelength 632.8 nm) (41) as our single-photon source. The CW laser output of 1 mW power was attenuated to about 50 fW, which corresponds to an average photon flux of $10^5$ photons/s. The average time between photons in our experiment far exceeded the time taken for light to pass through the circuit, which was about $10^{-8}$ s. In FIG. 4, (42) indicates an optical field attenuator, (43) indicates a pin-hole, (44) indicates a lens, (45) and (46) indicate a mirror, $D_i$ (i=0 to 6) indicates a photo-detector, HWP indicates a half wave plate, PBS indicates a polarizing beam splitter, APDi (i=1 to 6) indicates an avalanche photodiode, PZTi (i=1 or 2) indicates a piezo-transducer and CRi (i=1 or 2) indicates a corner reflector.

We used multimode optical fibers with coupling efficiency of more than 80% to direct the photons exiting the circuit to silicon avalanche photodiodes (APDs). The quantum efficiency and dark count of the APDs were typically 70% and less than 100 counts/s, respectively. The labels for each APD ($D_1$ to $D_6$) correspond to those of PDs in FIG. 3. Photon detections by APD1 (labeled $D_0$) correspond to successes for the fidelity measurement whereas photon detections by APD2, APD3 or APD6 correspond to failures. Since we did not need to discriminate the photo detection between $D_4$ and $D_5$, we used one APD for these detectors.

In essence, the optical circuit consists of Michelson and Mach-Zehnder interferometers controlled by piezo transducers PZT1 and PZT2, respectively. We used a bright reference light and adjusted the voltages of PZT1 and PZT2 to produce visibilities of more than 98% for these interferometers. The reference light was then switched off and the signal photons were guided into the circuit. The single-photon events were counted by six APDs for each block state $|B_L\rangle$. The gating time of the APDs was 5 seconds with the combined count over 1 second being of the order of $10^5$. The whole apparatus was shielded by a black box and the number of background photons was much smaller than the dark count of the APDs. Also, we estimated the number of events where two photons are present simultaneously in the circuit to be less than half the dark count. Our use of a photon source with random arrival times means that the quantum coding-decoding operations occur in the context of post selection measurements; that is, we knew that a quantum coding-decoding operation had taken place after it had occurred and, due to the limited efficiency of the photo detectors, in a subset of possible cases.

The experimental fidelity for protocol $P_1$ is given by the following:

$$F_1^{ex} = \sum_L \frac{1}{8} \frac{N_0^L}{\sum_{j=0}^{6} N_j^L} \quad (9)$$

where $N_j^L$ is the number of photons detected by the detector $D_j$ for the block state $|B_L\rangle$. By varying the angle $\theta$, the fidelity of our quantum coding-decoding experiment can be compared by the theoretical predictions given of the previous section over a range of values of $\alpha$. The results are shown in FIG. 1 as solid circles.

EXAMPLE 2

Implementing Protocol $P_2$

For protocol $P_2$, rather than switching a horizontally polarized light source into route A each time one of the PDs $D_1$ or $D_2$ recorded a photon, we performed a two step procedure as follows. The first step was the same as for protocol $P_1$ and, in fact, we used the same photon counting data $N_j^L$ as described above. The second step corresponds to the transmission of a horizontally polarized photon in channel A for each of the photons detected by $D_1$ and $D_2$ in the first step. For this purpose, the corner reflector CR1 was removed and horizontally polarized and attenuated light from a He—Ne laser was directed into the circuit. The number of photons used (i.e., the total number of photons detected by all APDs) in this second step was adjusted to be $N_1^L + N_2^L$ for each corresponding block state $|B_L\rangle$. We could make this adjustment with an accuracy of 3% by carefully controlling the gating time of the APDs. The total fidelity for this protocol is given by $$F_2^{ex} = \sum_L \frac{1}{8} \frac{N_0^L + N_0^{L(2)}}{\sum_{j=0}^{6} N_j^L}. \quad (10)$$

where $N_0^{L(2)}$ is the total number of photons detected by $D_0$ in the second step. We obtained the fidelities corresponding to several values of $\alpha^2$ and have plotted them as open circles in FIG. 1. The experimental fidelities for both protocols exceeded that of the simple protocol $P_3$ for a range of $\alpha^2$ values.

INDUSTRIAL APPLICABILITY

The quantum coding and decoding apparatuses and the quantum communication system of the present invention can be used in quantum data communication. In particular, the ability to compress block messages would allow a reduction in the channel resources needed for a given rate of quantum information transfer.

The invention claimed is:

1. Quantum source coding apparatus for communication of quantum information comprising:
   a quantum state preparation device for converting input messages into block messages;
   a coding device for producing coded signals by compressing the block messages prepared by the quantum state preparation device; and
   an output device for outputting the coded signals produced by the coding device;
   the quantum state preparation device comprises:
   a first half wave plate;
   a first polarizing beam splitter for receiving an output light from the first half wave plate to be separated into horizontal and vertical polarizations;
   a second half wave plate for receiving a light of the horizontal polarization separated by the first polarizing beam splitter;
   a second polarizing beam splitter for receiving a light from the second half wave plate to be separated into horizontal and vertical polarizations;
   a propagation route (route A) where the horizontal polarization separated by the second polarizing beam splitter is outputted;
   a propagation route (route B) where the vertical polarization separated by the second polarizing beam splitter is outputted;
   a third half wave plate for receiving a light of the vertical polarization separated by the first polarizing beam splitter;
   a third polarizing beam splitter for receiving a light from the third half wave plate to be separated into horizontal and vertical polarizations;
   a propagation route (route C) where the vertical polarization separated by the second polarizing beam splitter is outputted;
   a propagation route (route D) where the horizontal polarization separated by the second polarizing beam splitter is outputted;
   a fourth half wave plate for receiving a light from the propagation route (route A) where the horizontal polarization separated by the second polarizing beam splitter is outputted;
   a fifth half wave plate for receiving a light from the propagation route (route B) where the vertical polarization separated by the second polarizing beam splitter is outputted;
   a sixth half wave plate for receiving a light from the propagation route (route C) where the vertical polarization separated by the second polarizing beam splitter is outputted; and
   a seventh half wave plate for receiving a light from the propagation route (route D) where the horizontal polarization separated by the second polarizing beam splitter is outputted;
   the coding device comprises:
   an eighth half wave plate for adjusting a polarization plane in order to exchange the vertical polarization and the horizontal polarization of an input light from the sixth half wave plate;
   a fourth polarizing beam splitter for receiving a light from the eighth half wave plate and a light from the fifth half wave plate; and
   a ninth half wave plate, provided on a route where a light of the horizontal polarization from the eighth half wave plate and a light of the vertical polarization from the fifth half wave plate are inputted from among routes from the fourth polarizing beam splitter, for adjusting a polarization plane in order to exchange the vertical polarization and the horizontal polarization of an input light;
   the propagation route (route A) where the horizontal polarization separated by the second polarizing beam splitter is outputted is connected to the output device;
   the propagation route (route B), where a light of the vertical polarization front the eighth half wave plate and a light of the horizontal polarization from the fifth half wave plate are inputted from among routes from the fourth polarizing beam splitter, is connected to the output device;
   the propagation route (route C), where a light of the horizontal polarization from the eighth half wave plate and a light of the vertical polarization from the fifth half wave plate are inputted from among routes from the fourth polarizing beam splitter, is not connected to the output device; and
   the propagation route (route D) where a light from the seventh half wave plate is inputted, is not connected to the output device.

2. A quantum information communication system comprising a quantum source coding apparatus according to claim 1 and a quantum source decoding apparatus.

* * * * *